United States Patent [19]

Collins et al.

[11] Patent Number: 4,982,153

[45] Date of Patent: Jan. 1, 1991

[54] METHOD AND APPARATUS FOR COOLING AN INTEGRATED CIRCUIT CHIP DURING TESTING

[75] Inventors: David R. Collins, Eau Claire; Perry D. Franz, Elk Mound; Pamela W. Taylor, Eau Claire, all of Wis.

[73] Assignee: Cray Research, Inc., Chippewa Falls, Wis.

[21] Appl. No.: 307,259

[22] Filed: Feb. 6, 1989

[51] Int. Cl.⁵ ............................ G01R 1/00; G01R 1/02
[52] U.S. Cl. ............................ 324/158 F; 324/158 P; 324/158 R; 279/3
[58] Field of Search ................ 165/80.4, 86; 279/1 R, 279/320; 324/158 P, 158 F, 158 R, 73 PC; 409/135

[56] References Cited

U.S. PATENT DOCUMENTS

| | | |
|---|---|---|
| 2,730,220 | 1/1956 | Dodd .................................. 279/1 R |
| 2,942,891 | 6/1960 | Zale ................................... 279/1 R |
| 3,706,412 | 12/1972 | Latham, Jr. ............................ 279/3 |
| 3,710,251 | 1/1973 | Hagge et al. ..................... 324/158 F |
| 3,979,671 | 9/1976 | Meeker et al. .................. 324/158 F |
| 4,391,511 | 7/1983 | Akiyama et al. ....................... 279/3 |
| 4,567,432 | 1/1986 | Buol et al. . |
| 4,604,572 | 8/1986 | Horiuchi et al. ................ 324/158 F |
| 4,724,222 | 2/1988 | Feldman ................................... 279/3 |
| 4,757,255 | 7/1988 | Margozzi ......................... 324/73 PC |

FOREIGN PATENT DOCUMENTS

| | | | |
|---|---|---|---|
| 0044673 | 3/1980 | Japan ................................. 165/80.4 |
| 0094902 | 6/1983 | Japan ..................................... 279/3 |

OTHER PUBLICATIONS

"Liquid Cooling of a Multichip Module Package", by Balderes et al., IBM Tech. Dicsl. Bull., vol. 20, No. 11A, 4/78, pp. 4336-4337.

Primary Examiner—Reinhard J. Eisenzopf
Assistant Examiner—William J. Burns
Attorney, Agent, or Firm—Merchant, Gould, Smith, Edell, Welter & Schmidt

[57] ABSTRACT

A method and apparatus for testing integrated circuit devices includes a cooling chuck which is extensible within a bore in a cooling chuck body to a position in thermal contact with the integrated circuit device. The temperature of the cooling chuck is regulated by a fluid cooling system, which can be set to operate at a selected capacity to maintain the integrated circuit device at a desired temperature during testing.

27 Claims, 4 Drawing Sheets

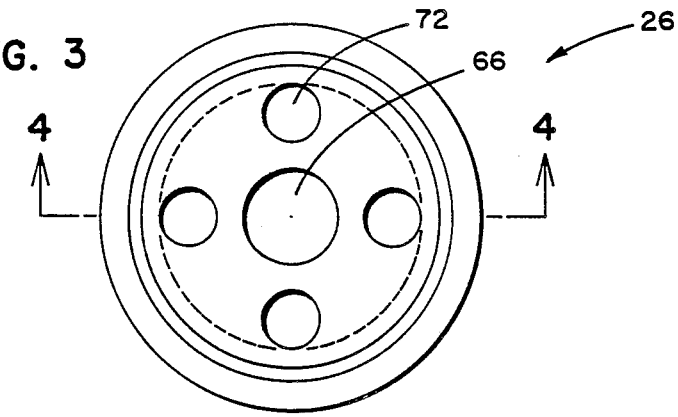
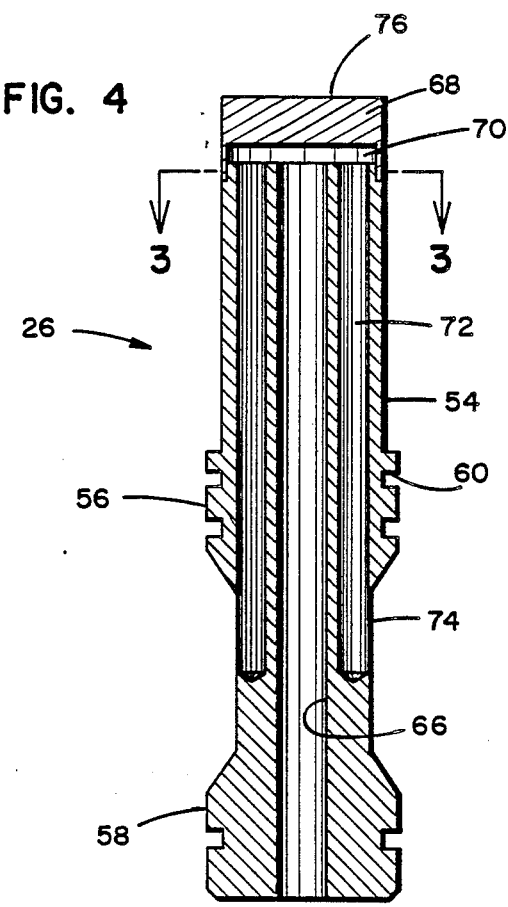

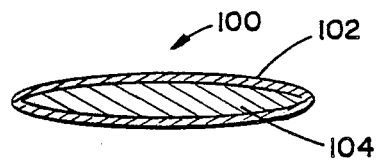
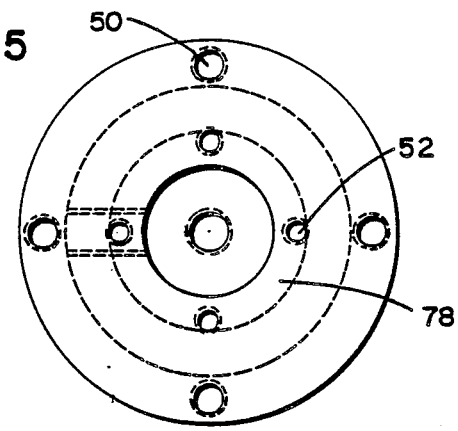
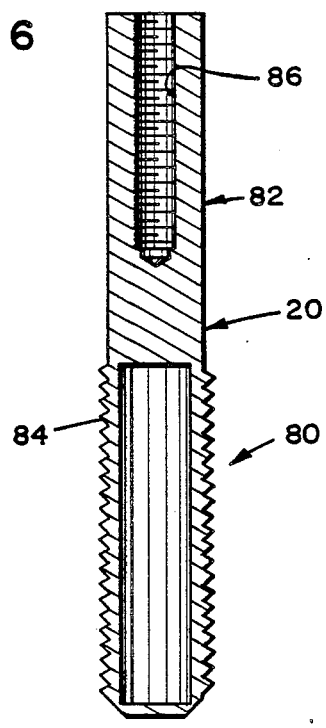

METHOD AND APPARATUS FOR COOLING AN INTEGRATED CIRCUIT CHIP DURING TESTING

BACKGROUND OF THE INVENTION

1. Field of the Invention

The present invention relates to a method and apparatus for cooling an integrated circuit device which is mounted in a socket for testing. More particularly, the present invention relates to a cooling chuck system which thermally engages an integrated circuit device during testing to maintain it at a stable temperature.

2. Description of the Prior Art

In high speed super computers of the type produced by Cray Research, Inc., the assignee of this application, banks of printed circuit boards containing integrated circuit devices are used to complete the circuitry which enables high speed calculations to be performed. As computer design evolves toward circuitry of ever increasing density, the operating temperature thereof becomes higher and cooling systems must be integrated into the physical packing which is provided for the circuitry. By using various different methods, the actual operating temperature of any particular integrated circuit within the computer can be estimated.

Prior to beginning actual production of an expensive, complicate super computer, it is essential that each individual integrated circuit device be tested at its estimated operating temperature to ensure against temperature caused failure. From a cost standpoint, it is important that such testing be conducted quickly and efficiently. It is clear that there has existed a long and unfilled need in the prior art for an integrated circuit cooling apparatus and method to determine the actual performance of an integrated circuit device at a predetermined temperature.

SUMMARY OF THE INVENTION

Accordingly, it is an object of the present invention to provide an integrated circuit cooling apparatus and method to determine the actual performance of an integrated circuit device at a predetermined temperature.

In order to achieve the foregoing object, an apparatus according to the instant invention is for dissipating thermal energy produced by a board mounted electronic device or the like during testing, comprising a chuck holder body having a board defined therein; a cooling chuck for conducting heat from the electronic device to the chuck holder body, the cooling chuck being slidably received within the chuck holder bore; structure adapted for mounting the chuck holder body to the board; and structure for extending the cooling chuck within the chuck holder bore toward the electronic device, whereby the temperature of the electronic device is controlled during testing.

According to the instant invention, a method for testing an integrated circuit device includes providing a testing assembly including a test board adapted for receiving the integrated circuit device, a chuck holder body having a board defined therein, cooling chuck structure slidably received in the chuck holder bore, structure for mounting the chuck holder body to the board and structure for extending the cooling chuck structure within the chuck holder bore toward the test board; using the mounting structure to mount the chuck holder body to the test board; presetting the cooling chuck structure to a predetermined temperature; inserting the integrated circuit device into the test board; extending the cooling chuck structure with the extending structure to establish thermal contact between the cooling chuck structure and the integrated circuit device; and maintaining the cooling chuck structure at the predetermined temperature while testing, whereby operation of the integrated circuit device may be tested at the predetermined temperature.

These and various other advantages and features of novelty which characterize the invention are pointed out with particularity in the claims annexed hereto and forming a part hereof. However, for a better understanding of the invention, its advantages, and the objects obtained by its use, reference should be made to the drawings which form a further part hereof, and to the accompanying descriptive matter, in which there is illustrated and described a preferred embodiment of the invention.

BRIEF DESCRIPTION OF THE DRAWINGS

FIG. 3 is a top view of a cooling chuck according to the instant invention, taken in cross-section along lines 3—3 in FIG. 4;

FIG. 4 is a side cross-sectional view of the cooling chuck shown in FIG. 3, taken along lines 4—4 in FIG. 3;

FIG. 5 is a top view of the cooling chuck body illustrated in FIG. 2;

FIG. 6 is a cross-sectional view of the alignment screws of the invention; and

FIG. 7 is a cross-sectional view of a thermally conductive pad constructed according to the invention.

DETAILED DESCRIPTION OF THE PREFERRED EMBODIMENT(S)

Figure 1:
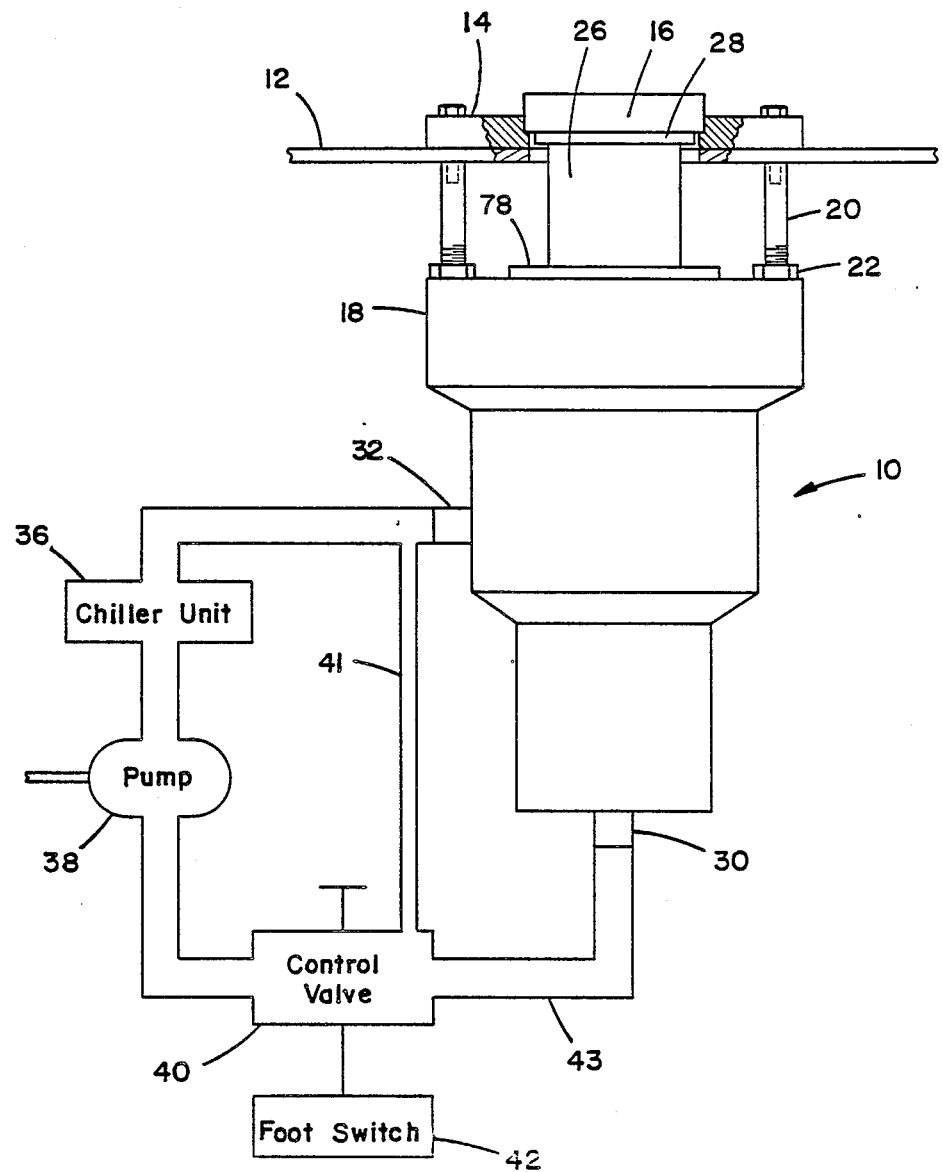
FIG. 1 is a schematic view of an apparatus constructed according to the preferred embodiment of the invention.

Referring now to the drawings, wherein like reference numerals designate corresponding elements throughout the views, and particularly referring to FIG. 1, an improved device for regulating the temperature of an integrated circuit device during testing is shown. Integrated circuit testing and cooling chuck system 10 includes a test board 12 having a test socket 14 in which an integrated circuit device 16 may be mounted. Testing and cooling chuck system 10 includes a chuck holder body 18 which is supported and aligned with respect to test socket 14 by a plurality of alignment screws 20, as will be further described below. A corresponding number of locking nuts 22 are provided to axially fix alignment screws 20 with respect to chuck body 18. Alignment screws 20 are secured to test socket 14 and test board 12 by means of a corresponding number of bolts or studs 24 which extend into an internal threaded portion of the alignment screws 20.

Figure 2:
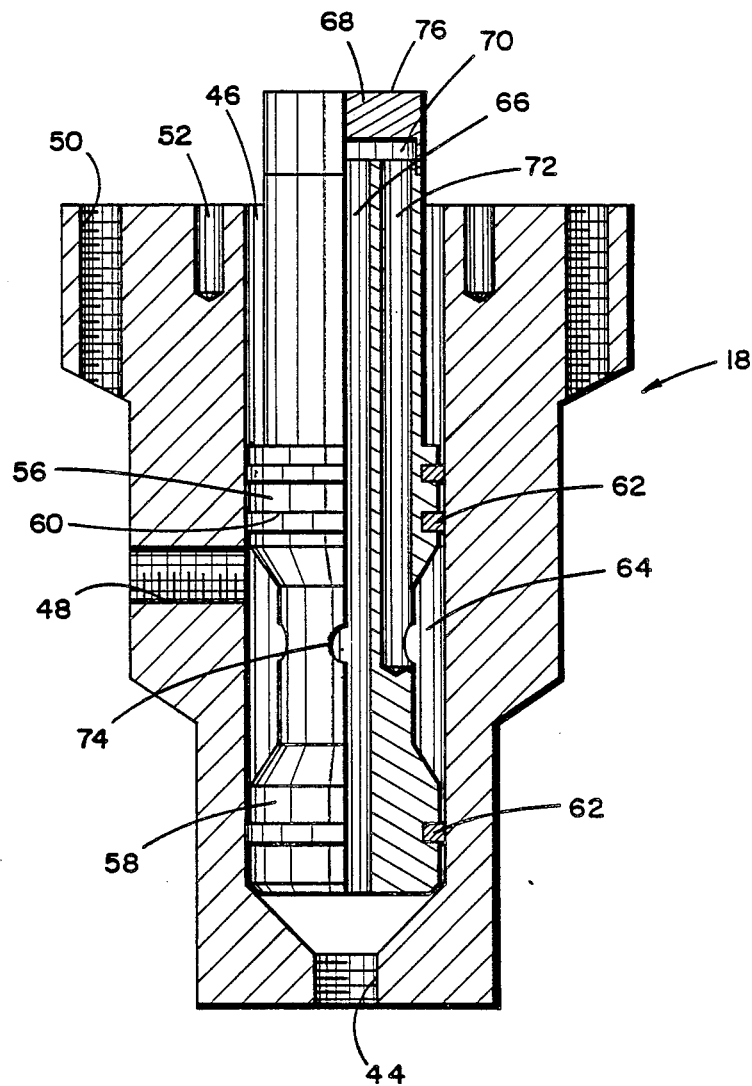
FIG. 2 is a cross-sectional view of the chuck holder body illustrated in FIG. 1.

Referring again to FIG. 1, testing system 10 includes a cooling chuck ram 26 which is disposed for sliding movement within a cylindrical bore 46 defined in chuck body 18, as may be seen in FIG. 2. Chuck holder body 18 further has a coolant inlet 30 defined in a lower portion thereof having an inlet port 44 which is in communication with a lower portion of the cylindrical bore 46. A coolant outlet 32 is defined in a side wall portion of chuck holder body 18 and is also in communication with cylindrical bore 46, as may be seen in FIG. 1. A coolant circuit 34 is provided to circulate a cooling fluid between the coolant inlet 30 and coolant outlet 32 of the chuck holder body 18. Coolant circuit 34 includes a chiller unit 36 which is of conventional design and capable of regulating the temperature of a coolant flowing through coolant circuit 34. A pump 38 is provided to circulate coolant within the coolant circuit 34, and a fluid control valve 40 which is preferably solenoid actuated. Valve 40 is shiftable between a first position in which fluid is directed through an operative path 43 into the chuck body or a second position in which the coolant is directed through a bypass path 41, as is shown in FIG. 1. Valve 40 may be conveniently controlled through a remote switch 42, which, in the preferred embodiment, is actuatable by the foot of an operator In operation, the coolant fluid may be circulated through bypass path 41 until it reaches a predetermined temperature, at which time it may be shifted to flow through path 43 and chuck holder body 18.

As also shown in FIG. 2, chuck holder body 18 includes a plurality of tapped holes 50 about an upper peripheral surface thereof, which extend in a direction parallel to the axis of cylindrical bore 46. As is best seen in FIG. 5, cooling chuck ram 26 is held within chuck body 18 by a retaining ring 78. Retaining ring 78 is secured with respect to chuck body 18 by a plurality of bolts which extend into a corresponding number of mounting holes 52. In the preferred embodiment, there are four such mounting holes, and four tapped holes 50.

Referring to FIG. 4, the cooling chuck ram 26 will now be described in detail. Ram 26 includes a longitudinally extending body portion 54 having an upper enlarged portion 56 and a lower enlarged portion 58. Upper and lower enlarged portions 56, 58 are both formed to have a radial cross-section and to sealingly engage the wall defining cylindrical chuck holder bore 46. To that end, a number of annular recesses 60 are formed circumferentially about each of the upper and lower enlarged portions 56, 58 for receiving a corresponding number of 0-rings 62 therein in order to provide a tight seal with the surface defining bore 46. As may be seen in FIG. 1, a space 64 is defined by the surface which defines cylindrical bore 46, the upper enlarged portion 56 and the lower enlarged portion 58. Chuck body 18 and ram 26 are so formed so that space 64 is always in communication with the outlet port 48 formed in the side of chuck body 18.

Referring again to FIG. 4, a longitudinal bore 66 is defined in ram 26 so as to communicate with the portion of bore 46 beneath the ram. Ram 26 further includes a thermally conductive top cap member 68 which is preferably formed of copper or another material having high thermal conductivity. A chamber 70 is defined between top cap 68 and the remainder of ram 26, which is in communication with the longitudinal bore 66. A plurality of return passages, of which there are four in the illustrated embodiment, communicate with chamber 70 and the portion of the longitudinally extending body section of ram 26 which is between enlarged portions 56 and 58. Return passages 72 open out into space 64 through a corresponding number of orifices 74 which are defined in the wall of elongate body portion 54. Top cap 68 preferably has a flat upper surface 76 that is adapted to bear against an integrated circuit device or a heat transfer facilitation medium 28 which is placed between top cap 68 and the integrated circuit device.

Referring to FIGS. 1 and 6, alignment screws 20 each preferably have a first end portion with external threads 84 formed thereon for threaded insertion into a corresponding tapped hole 50. Alignment screws 20 further have a second end portion 82 with a bore formed therein having internal threads 86. The bores bearing internal threads 86 are sized to receive the bolts or studs 24 which are used to secure alignment screws 20 to the test socket 14 and test board 12.

According to the preferred method of the present invention, cooling chuck body 18 is first secured to the underside of test board 12, as is shown in FIG. 1. Preferably, only three alignment screws 20 are used to effect such mounting, so that a planar stability which is characteristic of three point connections is achieved At approximately the same time, the chiller unit 36 is turned on and coolant is allowed to flow in a circuitous path through passage 43 and chuck body 18 to set the coolant and cooling chuck ram 26 at a predetermined temperature. Due to the piston-cylinder action between cooling chuck ram 26 and chuck body 18, the cooling chuck ram 26 will be at its upper most position during this period. The chiller must run for approximately five minutes before any testing is done to allow the fluid temperature to stabilize.

Once the temperature of the coolant and cooling chuck ram 26 reaches its predetermined value, foot switch 42 may be actuated to cause fluid control valve 40 to direct flow of the coolant through bypass passage 41 rather than through the operative path 43, so that flow of the coolant bypasses cooling chuck body 18. In this way, the pressurization of the lower portion of cylindrical bore 46 is relieved, allowing cooling chuck ram 26 to drop into its lowermost position. At this time, the heat transfer facilitation mechanism 28, which, for example, may be a thermally conductive oil, may be placed upon the top surface 76 of the thermally conductive top cap 68. The foot switch 42 may then be actuated to cause fluid control valve 40 to return fluid flow through cooling chuck body 18, whereby cooling chuck ram 26 again rises and bears against the integrated circuit device 16 so as to establish a thermal connection therewith. Operation of integrated circuit 16 may then be tested at a controlled operating temperature as desired. When tests have been completed, foot switch 42 may be actuated to cause valve 40 to go into its bypass mode, so that coolant ceases to flow through chuck body 18 and cooling chuck ram 26 again drops to its lower position. At this time, the integrated circuit device 16 may be removed from test socket 14 and the process can be repeated if desired In order to adjust the rate of cooling which is provided at cooling chuck ram 26, the capacity of chiller unit 36 may be adjusted In addition, the rate of coolant flow through circuit 34 may be controlled, as may be the fluid pressure within coolant circuit 34. By varying these factors singularly or in combination, the present invention makes it possible to test a large number of integrated circuit devices at various operating temperatures which correspond to their predicted operating temperature in their proposed environment. As a result, a great deal of time and effort is eliminated from the testing process that is necessary for the development of sophisticated electronic devices such as the next generation of super computers.

According to a second embodiment of the invention, heat transfer facilitation mechanism 28 is formed as a thermally conductive pad 100. Pad 100 preferably has a thin outer layer 102 which is formed of polyethylene or an equivalent polymer, and an inner core of thermally conductive grease 104 sealed within outer layer 102. Use of pad 100 in lieu of a thermally conductive oil obviates the need to clean the integrated circuit device after testing, which further enhances the efficiency of the testing process. Preferably, outer layer 102 should have sufficient resiliency to prevent leakage or bursting of the pad 100 when pressure is applied to the pad 100 during testing. The grease 104 is preferably a commercially available silicone based grease such as Castell 802 ®.

It is to be understood, however, that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the full extent indicated by the broad general meaning of the terms in which the appended claims are expressed.

What is claimed is:

1. An apparatus for dissipating thermal energy produced by a board mounted electronic device during testing, comprising:
    a chuck holder body having a bore, and inlet port and an outlet port defined therein, said inlet and outlet ports being in communication with said bore;
    cooling chuck means for conducting heat from the electronic device to said chuck holder body, said cooling chuck means being slidably received within said chuck holder bore;
    means adapted for mounting said chuck holder body to the board; and
    means for extending said cooling chuck means within said chuck holder bore toward the electronic device, said extending means also comprising means for transferring heat away from said chuck holder body, whereby the temperature of the electronic device is controlled during testing.

2. Apparatus according to claim 1, wherein said extending means further comprises means for circulating a fluid in a path from said outlet port into said inlet port.

3. Apparatus according to claim 2, wherein said cooling chuck means comprises a longitudinally extending element including a lower enlarged porter which is sealingly engaged with the surface defining said chuck holder bore so as to be in a piston-cylinder arrangement with said chuck holder body, and said inlet port communicates with a lower section of said chuck holder bore that is beneath said lower enlarged portion, whereby fluid supplied by said circulating means urges said cooling chuck means upwardly toward the electronic device.

4. Apparatus according to claim 2, wherein said heat transferring means comprises a chiller system disposed in said circulation path.

5. Apparatus according to claim 2, wherein said extending means further comprises a control valve disposed in said circulation path.

6. Apparatus according to claim 5, wherein said control valve is solenoid actuated 7. Apparatus according to claim 5, further comprising foot operated switch means for controlling operation of said control valve.

8. Apparatus according to claim 3, wherein said longitudinally extending element includes a thermally conductive cap member mounted on an upper end thereof, means defining a chamber beneath said cap member and a longitudinally extending bore communicating said chamber with said lower section of said chuck holder bore.

9. Apparatus according to claim 8, wherein said longitudinally extending element further includes an upper enlarged portion sealingly engaged with said chuck holder bore surface, said upper and lower enlarged portions together with said chuck holder bore surface defining a fluid egress space; and means defining at least one return passage in said longitudinally extending element for communicating said chamber with said space, whereby cooling fluid may be circulated through said chamber to transfer heat away from said cap member.

10. Apparatus according to claim 9, wherein there are four return passages.

11. An apparatus for dissipating thermal energy produced by a board-mounted electronic device during testing comprising:
    a chuck holder body having a bore defined therein;
    cooling chuck means for conducting heat from the electronic device to said chuck holder body, said cooling chuck means being slidably received within said chuck holder bore;
    adjustable means adapted for mounting said chuck holder body to the board, said adjustable mounting means comprising a plurality of tapped holes provided in said chuck holder body and a plurality of alignment screws each having a first threaded end threadedly received in one of said tapped holes, and a second end adapted to be fastened to the board; and
    means for extending said cooling chuck means within said chuck holder bore toward the electronic device, whereby the temperature of the electronic device is controlled during testing.

12. An apparatus for dissipating thermal energy produced by a board-mounted device during testing, comprising:
    a chuck holder body having a bore defined therein;
    cooling chuck means for conducting heat from the electronic device to said chuck holder body, said cooling chuck means being slidably received within said chuck holder bore;
    means adapted for mounting said chuck holder body to the board;
    means for extending said cooling chuck means within said chuck holder bore toward the electronic device; and
    a heat transfer facilitation medium which is adapted to be positioned between said cooling chuck means and the electronic device, whereby the temperature of the electronic device may be controlled during testing.

13. An apparatus according to claim 12, wherein said heat transfer facilitation medium comprises:
    an outer layer comprised of a resilient material and defining an internal space therein; and
    a thermally conductive grease disposed in said internal space.

14. An apparatus according to claim 13, wherein said outer layer is formed of polyethylene.

15. An apparatus according to claim 13, wherein said grease is silicone-based.

16. Apparatus according to claim 11, further comprising a plurality of lock nuts which are fittable over said alignment screws, respectively, to secure the alignment screws at a desired position with respect to said chuck holder body.

17. Apparatus according to claim 11, wherein said second ends have an internally threaded bore therein adapted to receive a threaded member extending from the board.

18. Apparatus according to claim 11, wherein there are three alignment screws.

19. A method of dissipating heat from a board-mounted electronic device during testing, comprising:
(a) providing a testing assembly including a chuck holder body having a bore, an inlet port and an outlet port defined therein, said inlet and outlet ports being in communication with said bore; cooling chuck means slidably received in the chuck holder bore, means adapted for mounting the chuck holder body to the board and means for extending the cooling chuck means within the chuck holder bore toward the board the extending means including means for transferring heat away from the chuck holder body;
(b) mounting the testing assembly to the board using the mounting means;
(c) presetting the cooling chuck means to a predetermined temperature;
(d) extending the cooling chuck means by introducing a fluid into said bore through said inlet port toward the electronic device by using the extending means so that thermal contact therebetween is achieved; and
(e) maintaining the cooling chuck means at the predetermined temperature with the heat transferring means during testing of the electronic device, whereby operation of the electronic device may be tested at the predetermined temperature.

20. A method according to claim 19, further comprising the step of inserting a heat transfer facilitation medium between the cooling chuck means and the electronic device prior to step (d).

21. A method according to claim 19, wherein the heat transferring means includes a fluid circulation cooling system including a chiller system and a pump for regulating the temperature of the cooling chuck means, and step (c) is performed by operating the heat transferring means.

22. A method for testing an integrated circuit device, comprising:
(a) providing a testing assembly including a test board adapted for receiving the integrated circuit device, a chuck holder body having a bore, an inlet port and an outlet port defined therein, said inlet port and said outlet port being in communication with said bore, cooling chuck means slidably received in the chuck holder bore, means for mounting the chuck holder body to the board and means for extending the cooling chuck means within the chuck holder bore toward the test board, the extending means including means for transferring heat away from the chuck holder body;
(b) using the mounting means to mount the chuck holder body to the test board;
(c) presetting the cooling chuck means to a predetermined temperature;
(d) inserting the integrated circuit device into the test board;
(e) extending the cooling chuck means with the extending means by introducing a fluid into said bore through said inlet port, to establish thermal contact between the cooling chuck means and the integrated circuit device; and
(f) maintaining the cooling chuck means at the predetermined temperature with the heat transferring means while testing, whereby operating of the integrated circuit device may be tested at the predetermined temperature.

23. A method according to claim 22, wherein the heat transferring means includes a fluid circulation cooling system for cooling the cooling chuck means, said cooling system being in communication with said inlet port and said outlet port, and wherein step (c) is performed by operating the cooling system.

24. A method according to claim 23, wherein the extending means and its heat transferring means is arranged so that the cooling chuck means is caused to extend when the cooling system is operative, the method further comprising the step of deactivating the cooling system between steps (c) and (d) so that the cooling chuck means is in a retracted position prior to insertion of the integrated circuit device.

25. A method according to claim 24, further comprising the step of inserting a heat transfer facilitation medium between the cooling chuck means and the electronic device prior to step (e).

26. A method according to claim 25, wherein said inserting step comprises inserting a thermally conductive pad between the cooling chuck means and the electronic device.

27. A method according to claim 22, further comprising the steps of:
(g) deactivating the extending means to cause the cooling chuck means to withdraw from thermal contact with the integrated circuit device; and
(h) removing the integrated circuit device from the test board.

* * * * *